United States Patent [19]
Jeon et al.

[11] Patent Number: 5,805,012
[45] Date of Patent: Sep. 8, 1998

[54] SYSTEMS AND METHODS FOR COMPENSATING A BUFFER FOR POWER SUPPLY FLUCTUATION

[75] Inventors: Byung-Gil Jeon; Chul-Sung Park, both of Kyungki-do, Rep. of Korea

[73] Assignee: Samsung Electronics Co., Ltd., Suwon-city, Rep. of Korea

[21] Appl. No.: 653,438

[22] Filed: May 24, 1996

[30] Foreign Application Priority Data

May 25, 1995 [KR] Rep. of Korea .................. 13263/1995

[51] Int. Cl.$^6$ ..................................................... H03K 17/14
[52] U.S. Cl. ......................... 327/378; 327/285; 327/399; 327/538; 327/543
[58] Field of Search ..................................... 327/263, 264, 327/285, 378, 399, 538, 530, 543, 108

[56] References Cited

U.S. PATENT DOCUMENTS

| | | | |
|---|---|---|---|
| 4,433,252 | 2/1984 | Lewis | 307/269 |
| 4,791,326 | 12/1988 | Vajdic et al. | 307/571 |
| 4,906,863 | 3/1990 | Van Tran | 307/296.7 |
| 4,975,599 | 12/1990 | Petrovick, Jr. et al. | 307/443 |
| 5,164,621 | 11/1992 | Miyamoto | 307/591 |
| 5,300,837 | 4/1994 | Fischer | 307/491 |
| 5,440,277 | 8/1995 | Ewen et al. | 331/176 |
| 5,640,122 | 6/1997 | McClure | 327/530 |

*Primary Examiner*—Timothy P. Callahan
*Assistant Examiner*—Jung Ho Kim
*Attorney, Agent, or Firm*—Myers Bigel Sibley & Sajovec

[57] ABSTRACT

The speed gap between rise and fall times of a buffer biased by a power supply having a power supply voltage, the speed gap varying in a first manner with respect to the power supply voltage and in a second manner inverse to the first manner with respect to a bias current supplied to the buffer, is controlled by generating the bias current such that the bias current varies inversely with respect to the power supply voltage, thereby compensating for fluctuations in the power supply voltage and maintaining the speed gap within a predetermined range when the power supply voltage is greater than a power supply voltage threshold level. The buffer may include a bias transistor controlling the bias current, with the bias current controlled by regulating the differential voltage applied to a control electrode of the bias transistor with an inverse voltage regulator including a control voltage generator for generating a control voltage varying directly with respect to the power supply voltage when the power supply voltage is less than the power supply voltage threshold level and remaining at a control voltage set point level when the power supply voltage is greater than the power supply voltage threshold level, a current feedback regulator for varying the feedback current directly with respect to the power supply voltage, and an output voltage generator for generating the differential voltage from the feedback current and the control voltage such that when the control voltage is at the control voltage set point level, the differential voltage varies inversely with respect to the feedback current.

7 Claims, 5 Drawing Sheets

SYSTEMS AND METHODS FOR COMPENSATING A BUFFER FOR POWER SUPPLY FLUCTUATION

FIELD OF THE INVENTION

The present invention relates to electronic circuits, in particular, to systems and methods for compensating the transient response of electronic circuits.

BACKGROUND OF THE INVENTION

Signal buffering is a function commonly performed in a wide variety of electronics applications. Typically, a "buffer circuit" provides a high-impedance load, i.e., a low current load, such that an input signal may be used to drive multiple loads without overloading the input signal. As such, for example, buffer circuits are omnipresent in digital applications, wherein a wide variety of logic devices, memory devices, processors, registers and the like each employ buffer circuits to receive input signals, producing an output signal which may be used for further processing such as inversion, level shifting, logical combination and the like.

An example of a buffer circuit is illustrated in FIG. 1, wherein an inverting buffer circuit 100 biased between a pair of power supply voltages VDD, VSS, including a complementary MOSFET (CMOS) inverter structure having a p-channel MOSFET transistor 20 and an n-channel MOSFET transistor 30 arranged such that when an input signal is applied to an input node 50, an output signal is produced at an output node 60 representing an inverted version of the input signal. As illustrated, the buffer circuit includes a PMOS bias transistor 10 which controls bias current supplied to the CMOS inverter structure based upon a reference voltage applied to reference input 40 connected to the gate of the PMOS bias transistor 10 to regulate bias current in the CMOS inverter structure, as is commonly done in conventional buffer circuits.

The input signal applied at the reference input 40 typically is supplied from a voltage source which supplies a fixed voltage at the reference input 40 with respect to the power supply voltage VDD. The fixed voltage helps maintain a relatively constant bias current in the PMOS transistor 20 of the CMOS inverter structure, thus rendering the current supplied at the output 60 of the CMOS inverter, and thus the collector current through the output transistor 70, less sensitive to variations in the power supply voltage VDD and the "low" state voltage level of the input signal applied at the input node 50. An example of such a reference voltage source is the BiCMOS circuit described in U.S. Pat. No. 4,906,863 to Van Tran.

Although applying a fixed reference voltage between the reference node 40 and the power supply voltage VDD may render the buffer circuit 100 less sensitive to power supply fluctuations, variation in power supply voltage VDD may have undesirable effects on the switching characteristics of the buffer circuit 100. Fluctuation of the power supply voltage VDD may vary the charge at the output node 60 when the input signal is the "low" state and the charge on the PMOS transistor 20 of the CMOS inverter when the input signal is in the "high" state. As the power supply voltage VDD increases, the time required to discharge the capacitance at the output node 60 through the NMOS transistor 30 of the CMOS inverter upon transition of the input signal at the input node 50 from the "low" state to the "high" state generally increases, thus increasing the switching time of the output node 60 from "high" to "low." However, as the power supply voltage VDD increases, the increased charge on the PMOS transistor 20 when the input signal at the input node is in a "high" state generally increases the drive current at the output node 60 and decreases the switching time of the output node 60 from "low" to "high." Thus, an increasing speed gap between rise and fall times may be exhibited with increases in the power supply voltage VDD.

Decreased rise and fall times for the buffer 100 can lead to an underdamped situations which causes oscillation or unwanted pulses in the receiving circuit 200. This underdamping may be compensated. However, the rise and fall times of the buffer 100 exhibit an inverse relationship with the power supply voltage VDD, i.e., rise time decreases as fall time increases. Therefore, it may be difficult to design and fabricate circuits which can compensate for oscillations in the output of the buffer 100 without overdamping the output of the buffer 100 and causing undesirable switching delays. These delays may negatively effect device performance characteristics, for example, write recovery and data hold times in memory circuits.

SUMMARY OF THE INVENTION

In light of the foregoing, it is an object of the present invention to provide systems and methods for controlling the transient response characteristics of a buffer in the presence of power supply voltage fluctuations.

It is another object of the present invention to provide systems and methods for controlling the transient response characteristics of a buffer which maintain the speed gap, e.g., propagation delay, for rise and fall times of the buffer within a predetermined range in the presence of power supply fluctuations.

These and other objects, features and advantages are provided according to the present invention by systems and methods which control the transient response of a buffer which has a speed gap that varies as a first function of the power supply voltage and a second function of a bias current supplied to the buffer from the power supply, the second function inverse to the first function, by controlling the bias current such that the current varies inversely with respect to the power supply voltage, thereby compensating for fluctuations in the power supply voltage and maintaining the speed gap in a predetermined range. The buffer may include a transistor connected to a speed-gap varying signal buffer, which controls the bias current based on a differential voltage applied to its control electrode, and an inverse voltage regulator, responsive to the power supply and connected to the transistor, for regulating the differential voltage such that the bias current is varied inversely with respect to the power supply voltage. According to an inverse voltage regulator aspect of the present invention, an inverse voltage regulator is provided which regulates the differential voltage such that the differential voltage varies inversely with respect to the power supply voltage when the power supply voltage is greater than a power supply voltage threshold level.

In particular, according to the present invention, a buffer for producing an output signal from an input signal and biased by a bias current from a power supply having a power supply voltage includes a speed-gap varying signal buffer, responsive to the power supply and the input signal, for producing an output signal in response to an input signal, the speed-gap varying signal buffer producing a speed gap, i.e., a propagation delay, between a transition of the input signal and a transition of the output signal in response to the transition of the input signal, the speed gap varying as a first function of the power supply voltage and as a second function of the bias current, the second function inverse to the first function. The buffer also includes a bias current regulator, responsive to the power supply, for generating the bias current such that the bias current varies inversely with respect to the power supply voltage to thereby compensate for increases and decreases in the power supply voltage and maintain the speed gap within a predetermined range.

The bias current regulator may include a bias transistor connected to the speed-gap varying signal buffer and having a controlling electrode and a pair of controlled electrodes, the controlled electrodes conducting the bias current, the controlling electrode adapted to receive a differential voltage such that the bias current varies directly with respect to the differential voltage. An inverse voltage regulator, responsive to the power supply and connected to the transistor, may regulate the differential voltage such that when the power supply voltage is greater than a power supply voltage threshold level, the differential voltage varies inversely with respect to the power supply voltage to thereby inversely vary the bias current with respect to the power supply voltage.

The inverse voltage regulator may include a control voltage generator, responsive to the power supply, which generates a control voltage, the control voltage varying directly with respect to the power supply voltage when the power supply voltage is less than the power supply voltage threshold level, the control voltage remaining at a control voltage set point level when the power supply voltage is greater than the power supply voltage threshold level. A current feedback regulator, responsive to the power supply and to the control voltage generator, may vary the feedback current directly with respect to the power supply voltage, and an output voltage generator, responsive to the current feedback regulator and the control voltage generator, may generate the differential voltage from the feedback current and the control voltage such that when the control voltage is at the control voltage set point level, the differential voltage varies inversely with respect to the feedback current.

The current feedback regulator preferably includes a second transistor having a controlling electrode and a pair of controlled electrodes, the controlling electrode receiving the control voltage and the controlled electrodes conducting the feedback current. Preferably, the second transistor includes a field effect transistor including a gate electrode and a pair of channel electrodes, wherein the controlling electrode includes the gate electrode and the controlled electrodes include the channel electrodes.

According to method aspect of the present invention, the speed gap of a buffer powered by a power supply having a power supply voltage, the speed gap varying as a first function of the power supply voltage, the speed gap varying as a second function of a bias current supplied to the buffer from the power supply, the second function inverse to the first function, is controlled by regulating the bias current such that the bias current varies inversely with respect to the power supply voltage to thereby compensate for increases and decreases in the power supply voltage and maintain the speed gap within a predetermined range when the power supply voltage is greater than a power supply voltage threshold level. The buffer may include a bias transistor having a control electrode and a controlled electrode, the controlled electrode conducting the bias current from the power supply, the control electrode adapted to receive a differential voltage. The bias current may be regulated by regulating the differential voltage applied to the bias transistor such that the differential voltage varies inversely with respect to the power supply voltage, thereby inversely varying the bias current with respect to the power supply voltage.

BRIEF DESCRIPTION OF THE DRAWINGS

Some of the objects and advantages of the present invention having been stated, others will be more fully understood from the detailed description that follows and by reference to the accompanying drawings in which.

DETAILED DESCRIPTION

Figure 1:
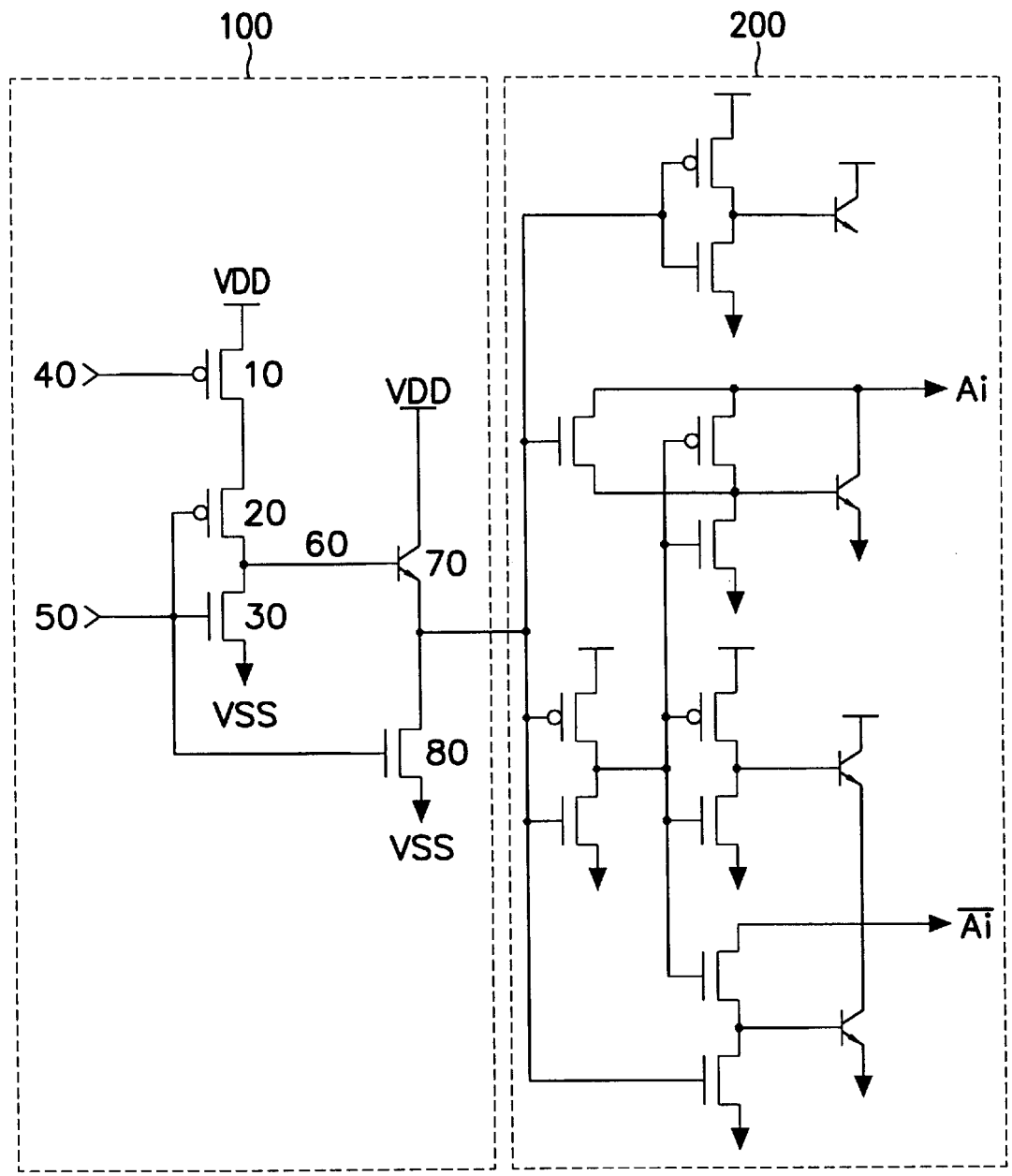
FIG. 1 is a schematic diagram illustrating a buffer circuit according to the prior art.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements throughout.

Figure 2:
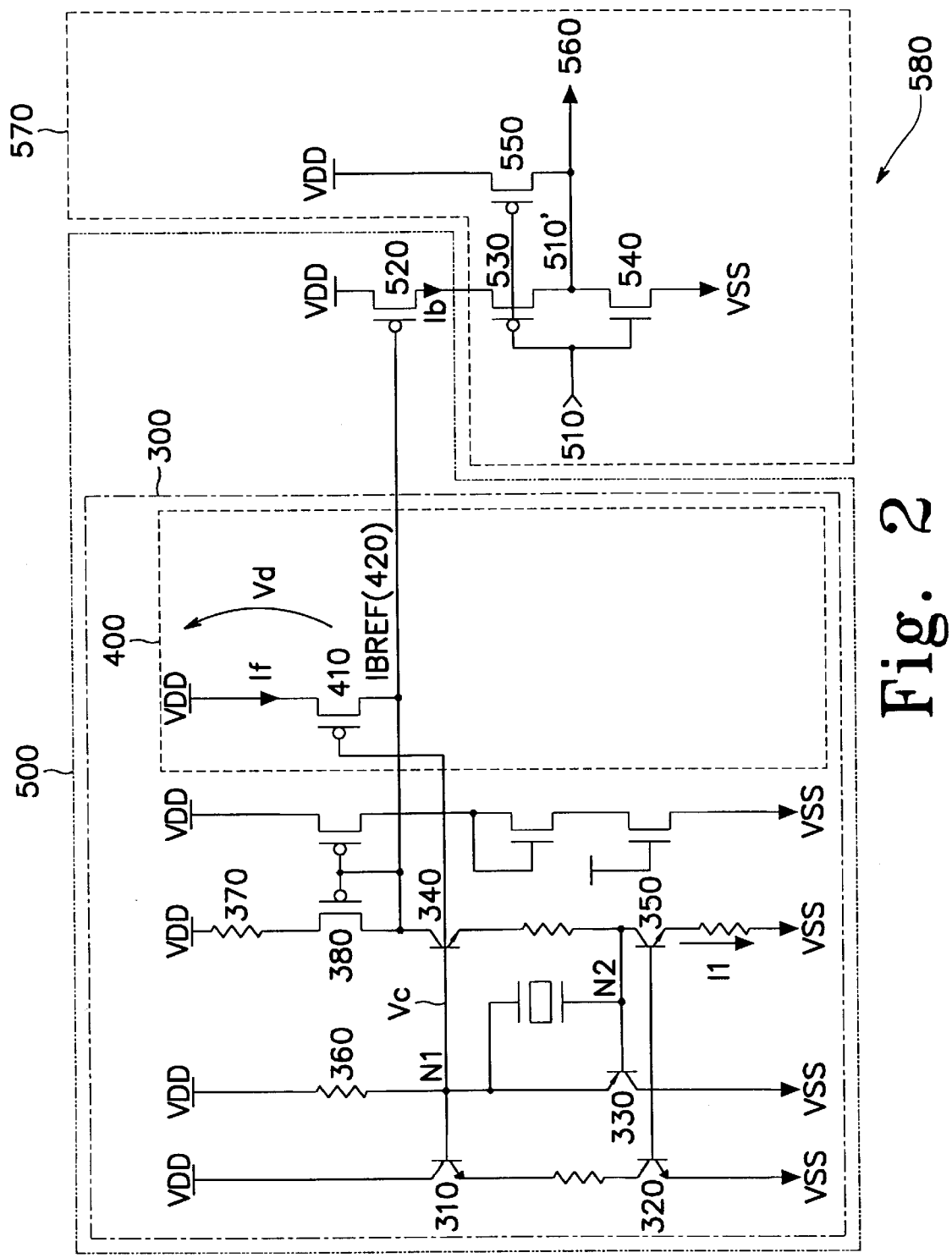
FIG. 2 is a schematic diagram illustrating a buffer circuit according to the present invention.

FIG. 2 illustrates a buffer 580 according to the present invention, including an inverse voltage regulator 300, a current feedback regulator 400, a bias current regulator 500, and a speed-gap varying signal buffer 570. As illustrated, the inverse voltage regulator 300 supplies a differential voltage Vd between an output node IBREF 420 and the power supply voltage VDD, which is used by the bias current regulator 500 to control a bias current Ib supplied to the speed-gap varying signal buffer 570. The differential voltage Vd is controlled such that when the power supply voltage VDD is above a power supply voltage threshold level, the differential voltage Vd varies inversely with the power supply voltage VDD.

In detail, the inverse voltage regulator 300 includes a control voltage generator for supplying a control voltage Vc at a control voltage node N1, and an output voltage generator for generating the differential voltage Vd at the output node IBREF 420. As illustrated, a current mirror circuit including transistors 310, 320, 330, 340, 350 is included in the inverse voltage regulator 300, which fixes the control voltage Vc with respect to a ground voltage VSS at a control voltage set point level when the power supply voltage is above a power supply voltage threshold level. For power supply voltages VDD above the power supply threshold voltage level, the output voltage generator, shown here including a resistor 370, a PMOS transistor 380, and an NPN transistor 340, produces a decreasing differential voltage Vd at the output node IBREF 420 as the power supply voltage VDD increases, due to increased feedback current If from the current feedback regulator 400. The increased feedback current If arises from increased gate to source voltage on the PMOS transistor 410 between the control voltage Vc, fixed by operation of the current mirror, and the increased power supply voltage VDD. Thus, the inverse voltage regulator 300 produces a differential voltage Vd which inversely varies with the power supply voltage VDD for power supply voltages above the power supply voltage threshold level.

The inverse voltage regulator 300, the current feedback regulator 400, and a PMOS transistor 520 are included in the bias current regulator 500 for generating a bias current Ib supplied to the speed-gap varying signal buffer 570 such that the bias current Ib inversely varies with respect to the power supply voltage VDD for power supply voltages greater than the power supply voltage threshold level. In the illustrated embodiment, the PMOS transistor 520 controls the bias current Ib in response to the differential voltage Vd generated by the inverse voltage regulator 300, which inversely varies with respect to the power supply voltage VDD for power supply voltages greater than the power supply voltage threshold level. The differential voltage Vd is applied to the control, e.g., gate, electrode of the transistor 520. As the power supply voltage VDD increases above the power supply voltage threshold level, the bias current Ib conducted through the controlled, e.g., channel, electrodes of the transistor 520 is reduced due to the decreased gate bias.

The speed-gap varying signal buffer 570 is illustrated including a CMOS inverter structure including a PMOS transistor 530 and an NMOS transistor 540. When a "high" voltage level signal is input at an input node 510, an output signal having a "low" state is produced at an output node 560. Conversely, when a "low" voltage level signal is input at the input node 510, an output signal having a "low" state is produced at the output node 560.

Figure 3:
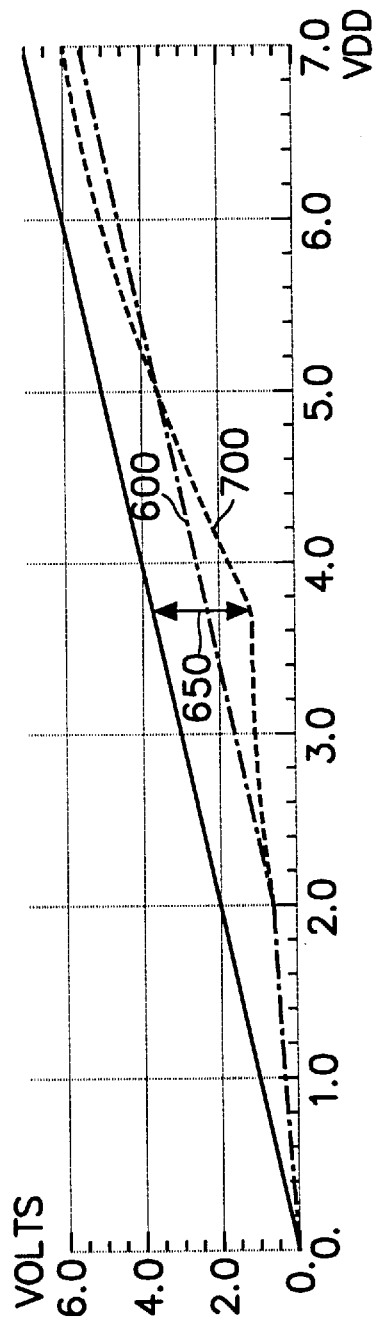
FIG. 3 is a chart illustrating voltage characteristics of an inverse voltage regulator according to the present invention.

Operation of the buffer of FIG. 2 may be explained in greater detail by reference to the operating characteristics illustrated in FIGS. 3–5. In FIG. 3, a first line 600 illustrates a voltage reference applied to bias a buffer circuit according to the prior art wherein the difference between the reference voltage and the power supply voltage VDD is maintained at a fixed level. The difference 650 between the power supply voltage VDD and a second line 700 represents a voltage characteristic for a differential output voltage Vd for biasing a buffer according to the present invention, wherein the differential voltage Vd varies inversely with respect to the power supply voltage VDD for power supply voltage greater than a power supply voltage threshold level Vk.

As may be seen in FIG. 3, the differential output voltage Vd varies directly with respect to the power supply voltage VDD for power supply voltages less the power supply voltage threshold level Vk. For the circuit embodiment illustrated in FIG. 2, for power supply voltages VDD less than the power supply voltage threshold level Vk, the effect of the current feedback regulator, i.e., the transistor 410, is overshadowed by the action of the voltage applied to the base of the NPN transistor 340, which causes the differential output voltage at the node IBREF 420 to rise as the power supply voltage VDD rises, albeit at a slower rate than the power supply voltage VDD, due to regulation of the current flowing in a resistor 370 and a PMOS transistor 380. When the power supply reaches the power supply voltage threshold level Vk, however, the current mirror circuit begins to limit the voltage at the base of the NPN transistor 340 and at the gate of the PMOS transistor 410, and thus fixes the current I1 flowing through the NPN transistor 340. For power supply voltages above the power supply threshold voltage level Vk, the action of the current feedback regulator 400 dominates, as increasing power supply voltage VDD applies a proportionally increasing gate bias to the PMOS transistor 410, pulling the node IBREF 420 towards the power supply voltage VDD. For the circuit embodiment of FIG. 2, the power supply voltage threshold level Vk may be adjusted through the selection of the resistance 360 between the node N1 which drives the base of the NPN transistor 340 and the power supply voltage VDD.

Figure 4:
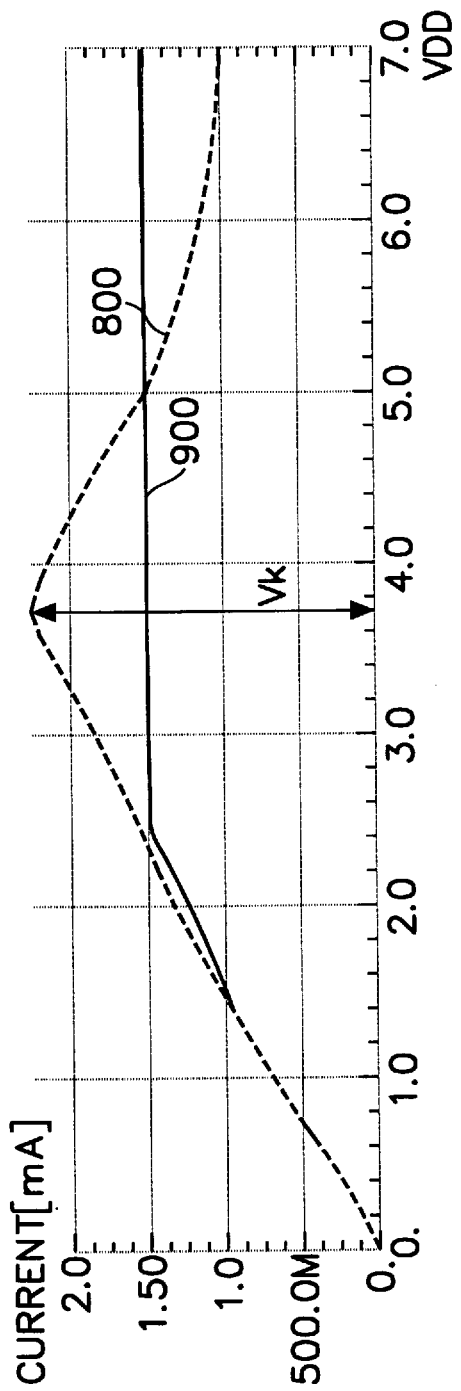
FIG. 4 is a chart illustrating current characteristics of a buffer according to the present invention.

FIG. 4 illustrates operational characteristics for the bias current Ib in the biasing transistor controlled by the differential voltage of FIG. 3. Reflecting the characteristic of the differential voltage Vd illustrated in FIG. 3, the bias current Ib, represented by a first line 800, exhibits a direct variance with respect to the power supply voltage VDD for power supply voltages less than the power supply voltage threshold level Vk, i.e., the bias current Ib increases with the power supply voltage VDD. For power supply voltages VDD greater than the power supply voltage threshold level Vk, the bias current Ib inversely varies with respect to the power supply voltage VDD, due to the decreased gate bias applied to the PMOS transistor 520. A second line 900 illustrates a bias current according to the prior art, which exhibits a nominally constant level for the same operational region.

Figure 5:
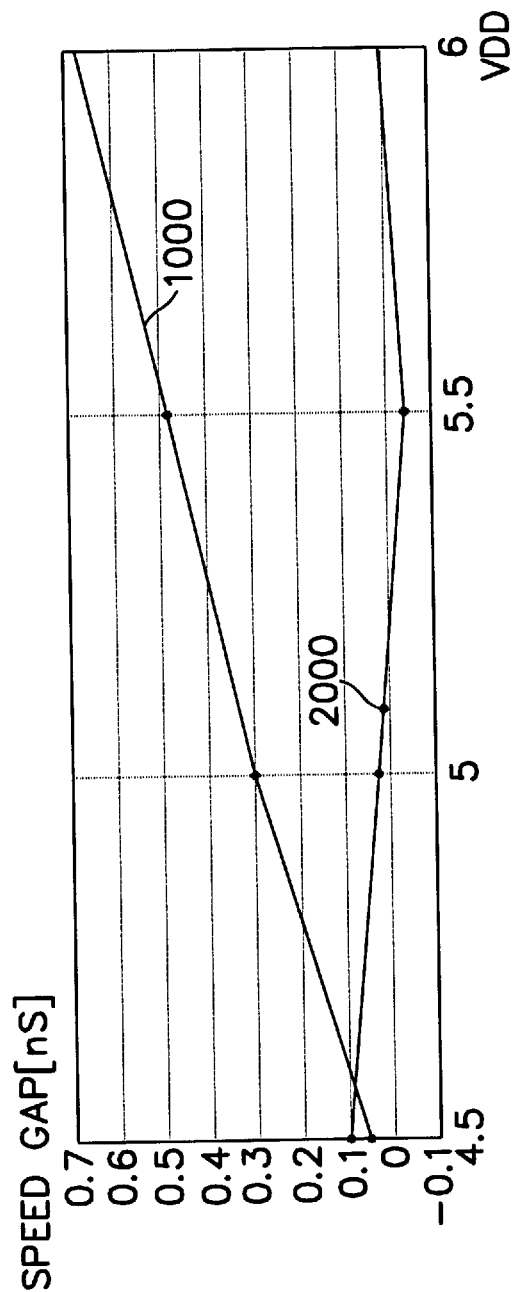
FIG. 5 is a chart illustrating speed gap characteristics of a buffer according to the present invention.

The effect of the bias current Ib characteristic on the speed gap (propagation delay) of the of the buffer circuit of FIG. 2 is illustrated in FIG. 5. A first line 1000 illustrates a speed gap characteristic for a buffer according to the prior art, which exhibits increasing speed gap as the power supply voltage VDD is increased. In contrast, the second line 2000, representing the speed gap of the buffer circuit of FIG. 2, exhibits decreased sensitivity to the fluctuation of the power supply voltage VDD.

Those skilled in the art will understand that the present invention is not limited to the components and configuration of the illustrated embodiment and the theory of circuit operation outlined with respect to the illustrated embodiment. Other circuit configurations may be used to provide the voltage regulating function of the inverse voltage regulator 300, for example, through direct feedback of the differential output voltage Vd. Similarly, the current feedback implemented using current feedback regulator 400 may be implemented using other configurations, for example, through sampling resistors and conversion to voltage feedback. In addition, the functions of the inverse voltage regulator 300, the current feedback regulator 400 and the speed-gap varying signal buffer 500 may implemented using functional analogs of the NMOS, PMOS, CMOS and bipolar circuit elements implemented in other technologies.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A buffer for producing an output signal from an input signal and biased by a bias current from a power supply having a power supply voltage, the buffer comprising:

a speed-gap varying signal buffer which is responsive to the power supply and the input signal and which produces an output signal in response to said input signal, the signal buffer producing a propagation delay between a transition of said input signal and a transition of said output signal in response to said transition of said input signal, said propagation delay varying as a first function of the power supply voltage and as a second function of the bias current, said second function being inverse of said first function; and an inverse bias current regulator, responsive to the power supply, for regulating the bias current such that the bias current varies directly with respect to the power supply voltage when the power supply voltage is below a power supply voltage threshold level and varies inversely with respect to the power supply voltage when the power supply voltage is above the power supply voltage threshold level to thereby compensate for variation in the power supply voltage and maintain said propagation delay within a predetermined range.

2. A buffer according to claim 1 wherein said bias current regulator comprises:

a bias transistor connected to said speed-gap varying signal buffer and having a controlling electrode and a pair of controlled electrodes, said pair of controlled electrodes conducting said bias current, said controlling electrode adapted to receive a voltage such that said bias current varies directly with respect to differential voltage between said voltage received at said controlling electrode and said power supply voltage; and an inverse voltage regulator, responsive to said power supply and connected to said bias transistor, which regulates said differential voltage such that when the power supply voltage is greater than a power supply voltage threshold level, said differential voltage varies inversely with respect to the power supply voltage to thereby inversely vary said bias current with respect to the power supply voltage.

3. A buffer according to claim 2 wherein said inverse voltage regulator comprises:

a control voltage generator, responsive to said power supply, which generates a control voltage, said control voltage varying directly with respect to said power supply voltage when said power supply voltage is less than said power supply voltage threshold level, said control voltage remaining at a control voltage set point level when the power supply voltage is greater than said power supply voltage threshold level;

a current feedback regulator, responsive to the power supply and to said control voltage generator, which varies a feedback current from the power supply directly with respect to the power supply voltage; and an output voltage generator means, responsive to said current feedback regulator and said control voltage generator, which generates said differential voltage from said feedback current and said control voltage such that when said control voltage is at said control voltage set point level, said differential voltage varies inversely with respect to said feedback current.

4. A buffer according to claim 3 wherein said current feedback regulator comprises:

a second transistor having a controlling electrode and a pair of controlled electrodes, said controlling electrode receiving said control voltage and said controlled electrodes conducting said feedback current.

5. A buffer according to claim 3 wherein said control voltage generator comprises a current mirror circuit which fixes said control voltage at said control voltage set point level when the power supply voltage is greater than said power supply voltage threshold level.

6. A method of controlling the propagation delay of a buffer powered by a power supply having a power supply voltage, the propagation delay varying as a first function of the power supply voltage, the propagation delay varying as a second function of a bias current supplied to the buffer from the power supply, the second function inverse to the first function, the method comprising the following step, performed when the power supply voltage is greater than a power supply voltage threshold level:

regulating the bias current such that the bias current varies directly with respect to the power supply voltage when the power supply voltage is below a power supply voltage threshold level and varies inversely with respect to the power supply voltage when the power supply voltage is above the power supply voltage threshold level to thereby compensate for increases and decreases in the power supply voltage and maintain the propagation delay within a predetermined range.

7. A method according to claim 6 wherein the buffer includes a bias transistor having a control electrode and a controlled electrode, the controlled electrode conducting the bias current from the power supply, the control electrode adapted to receive a voltage with respect to said power supply and controlling the bias current such that the bias current varies directly with respect to a differential voltage between the voltage received at the control electrode and the power supply voltage, and wherein said step of regulating the bias current comprises the steps of:

regulating the differential voltage applied to the bias transistor such that the differential voltage varies inversely with respect to the power supply voltage when the power supply voltage is above a power supply voltage threshold level, thereby inversely varying the bias current with respect to the power supply voltage.

* * * * *